(12) United States Patent
Neerhof et al.

(10) Patent No.: US 7,119,346 B2
(45) Date of Patent: Oct. 10, 2006

(54) LITHOGRAPHIC APPARATUS AND DEVICE MANUFACTURING METHOD

(75) Inventors: Hendrik Antony Johannes Neerhof, Eindhoven (NL); Gert-Jan Heerens, Schoonhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/986,181

(22) Filed: Nov. 12, 2004

(65) Prior Publication Data

US 2005/0151096 A1  Jul. 14, 2005

(30) Foreign Application Priority Data

Nov. 13, 2003  (EP) .................................. 03257165

(51) Int. Cl.
*A61N 5/00* (2006.01)
(52) U.S. Cl. ............................... 250/492.2; 250/492.3; 250/492.22
(58) Field of Classification Search .................. None
See application file for complete search history.

(56) References Cited

U.S. PATENT DOCUMENTS 6,122,159 A * 9/2000 Arai et al. .................. 361/234
6,169,652 B1 * 1/2001 Klebanoff ................... 361/234
6,178,221 B1   1/2001 Levinson et al.
6,351,367 B1 * 2/2002 Mogi et al. ................. 361/234

FOREIGN PATENT DOCUMENTS

| EP | 0 706 210 A1 | 4/1996 |
| EP | 1 182 510 A1 | 2/2002 |
| EP | 1 359 469 A1 | 11/2003 |

* cited by examiner

*Primary Examiner*—Nikita Wells
*Assistant Examiner*—Anthony Quash
(74) *Attorney, Agent, or Firm*—Pillsbury Winthrop Shaw Pittman LLP

(57) ABSTRACT

A lithographic apparatus is provided. The apparatus includes an illumination system for conditioning a beam of radiation, and a support for supporting a patterning device. The patterning device serves to impart the beam of radiation with a pattern in its cross-section. The apparatus also includes a substrate table for holding a substrate, a projection system for projecting the patterned beam onto a target portion of the substrate, and a high voltage conductor in a part of the apparatus that is evacuated or at a low pressure during normal use of the apparatus. The conductor is coated by an isolation layer having a conductivity that is high enough to prevent charge build-up on the outside thereof during use of the apparatus, and low enough to limit peak current flow during a breakdown.

12 Claims, 2 Drawing Sheets

LITHOGRAPHIC APPARATUS AND DEVICE MANUFACTURING METHOD

CROSS-REFERENCE TO RELATED APPLICATIONS

This application claims the benefit of priority from European Patent Application No. 03257165.5, filed Nov. 13, 2003, the entire content of which is incorporated herein by reference.

FIELD

The present invention relates to a lithographic apparatus, and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a lithographic apparatus using very short wavelength exposure radiation, e.g. EUV in the range of 5 to 20 nm, the beam path should be kept at a high vacuum or a low pressure, e.g. $10^{-3}$ mbar, of Argon, as the transmission of air at standard atmospheric pressure at such wavelengths is very low. To prevent particles from settling onto the mask, a so-called electrostatic pellicle that includes a grid of wires at a high voltage, e.g. 1000V, relative to the mask has been proposed. The electrostatic pellicle attracts particles, especially ions, approaching the mask, and prevents them settling thereon. A similar arrangement has been proposed to protect the mirrors in the illumination and projection system from damage and is disclosed in EP-1 182 510-A, as well as unpublished European Patent Applications Nos. 02079329.5 and 02079864.1, the contents of which are all incorporated herein by reference.

With any high voltage system, there is a risk of breakdown, especially during periods when the pressure in the system is rising or falling. As shown in FIG. 2 of the accompanying drawings, which shows breakdown potential difference vs. the product of pressure and distance (P.d), the breakdown voltage is high at low and high values of P.d, but has a minimum at about 1 mb.cm. The value of the minimum depends on what current flow is considered to be a breakdown, but for present purposes may be considered to be about 300V. Thus there is a risk of breakdown during pump down or when the system is returning to atmospheric pressure if high voltage systems, such as the electrostatic pellicle, are still operating. While these systems can normally be switched off during planned pressure changes, given the expense of masks and mirrors in a lithographic apparatus, it is desirable to provide protection to prevent damage that might be caused by a breakdown during an unplanned pressure change, such as one caused by a valve or software failure.

SUMMARY

It is an aspect of the present invention to provide an arrangement to prevent damage that may be caused by breakdowns in high voltage systems in a lithographic apparatus.

According to an embodiment of the invention, there is provided a lithographic apparatus that includes an illumination system for providing a projection beam of radiation, and a support structure for supporting a patterning device. The patterning device serves to impart the projection beam with a pattern in its cross-section. The apparatus also includes a substrate table for holding a substrate, a projection system for projecting the patterned beam onto a target portion of the substrate, and a high voltage conductor in a part of the apparatus that is evacuated or at a low pressure during normal use of the apparatus, characterized in that the conductor is coated by an isolation layer having a conductivity high enough to prevent charge build-up on the outside thereof during use of the apparatus and low enough to limit peak current flow during a breakdown.

According to an embodiment of the invention, a lithographic apparatus is provided. The apparatus includes an illumination system for conditioning a beam of radiation, and a support for supporting a patterning device. The patterning device serves to impart the beam of radiation with a pattern in its cross-section. The apparatus also includes a substrate table for holding a substrate, a projection system for projecting the patterned beam onto a target portion of the substrate, and a high voltage conductor in a part of the apparatus that is evacuated or at a low pressure during normal use of the apparatus. The conductor is coated by an isolation layer having a conductivity that is high enough to prevent charge build-up on the outside thereof during use of the apparatus, and low enough to limit peak current flow during a breakdown.

If a conventional insulation layer is provided on the conductors, e.g. of an electrostatic pellicle or an ion damage protection system, then charged particles that are attracted to the conductors may build up on the surface of the insulation layer until the external electric field is compensated and the conductor may no longer fulfill its function. According to the invention, an isolation layer is provided that has a non-zero conductivity so that sufficient current may flow to neutralize charged particles that are attracted to the conductor, but a sufficiently low conductivity to limit peak current flows during a breakdown to safe levels. In this way, the apparatus may be protected from breakdowns, without preventing the high voltage systems from fulfilling their functions.

The exact conductivity range that is suitable will depend on the application, for example, the voltage in the high voltage system, what breakdown currents are acceptable and what current should be used to prevent charge build-up. However, a total resistance of the coating in the range of $1\times10^8$ to $1\times10^{12}$, preferably $1\times10^9$ to $1\times10^{11}$, $\Omega m^{-2}$ is suitable for many applications. Suitable materials for the coating include $Al_2O_3$, $SiO_2$, or lacquers. The thickness of the coating may be in the range of 10–50 μm and a resistivity in the range of $1\times10^{13}$ to $1\times10^{17}$, preferably $1\times10^{14}$ to $1\times10^{16}$, $\Omega m$.

According to an embodiment of the invention, there is provided a device manufacturing method using a lithographic apparatus that includes: providing a substrate; providing a projection beam of radiation using an illumination system, using a patterning device to impart the projection beam with a pattern in its cross-section, and projecting the patterned beam of radiation onto a target portion of the substrate. During use of the apparatus, at least one part thereof is protected from damage by charged particle by a high voltage system; characterized in that: a conductor of the high voltage system is coated by an isolation layer having a conductivity high enough to prevent charge build-up on the outside thereof during use of the apparatus and low enough to limit peak current flow during a breakdown.

According to an embodiment of the invention, a device manufacturing method using a lithographic apparatus is provided. The method includes patterning a beam of radiation, projecting the patterned beam of radiation onto a target portion of a substrate, and supplying high voltage to a part of the apparatus with a high voltage conductor. The conductor is coated by an isolation layer having a conductivity that is high enough to prevent charge build-up on the outside thereof during use of the apparatus, and low enough to limit peak current flow during a breakdown.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
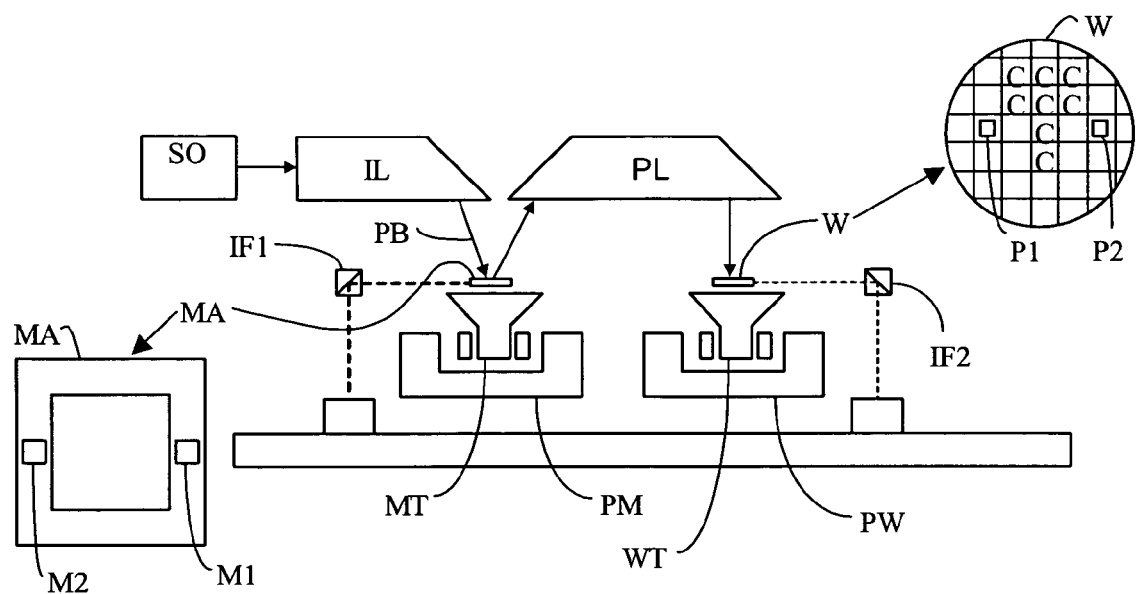
FIG. 1 depicts a lithographic apparatus according to an embodiment of the invention.
Figure 2:
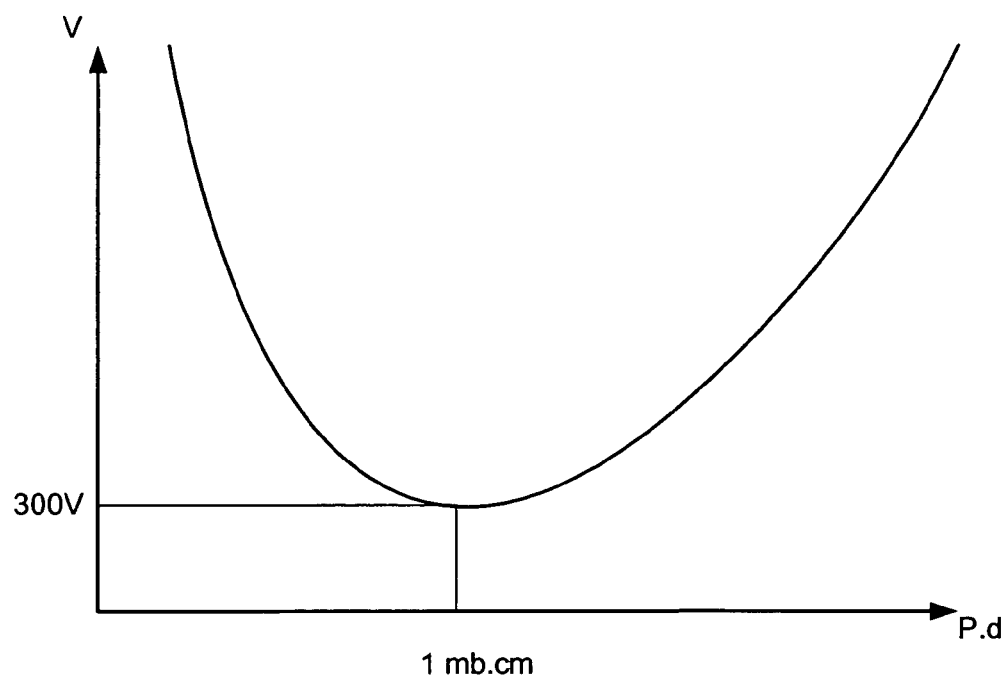
FIG. 2 is a graph of breakdown voltage vs. P.d illustrating the Paschen effect.

FIG. 1 schematically depicts a lithographic apparatus according to an embodiment of the invention. The apparatus includes: an illumination system (illuminator) IL for providing a projection beam PB of radiation (e.g. UV or EUV radiation), a first support structure (e.g. a mask table) MT for supporting a patterning device (e.g. a mask) MA and connected to a first positioner PM for accurately positioning the patterning device with respect to item PL, a substrate table (e.g. a wafer table) WT for holding a substrate (e.g. a resist-coated wafer) W and connected to a second positioner PW for accurately positioning the substrate with respect to item PL, and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjuster for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator IL provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioner PW and position sensor IF2 (e.g. an interferometric device), the substrate table WT can be moved accurately, e.g. so as to position different target portions C in the path of the beam PB. Similarly, the first positioner PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 3:
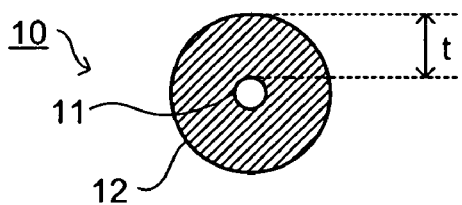
FIG. 3 is a cross-section of a conductor coated with an isolation layer according to the invention.

FIG. 3 shows in cross-section a conductor 10 in a high voltage system in an embodiment of the invention. The conductor may be part of an electrostatic pellicle, such as that described in the aforementioned European Patent Application EP-A-1 182 510, or an ion protection system as described in EP-1 182 510-A, as well as the aforementioned unpublished European Patent Applications nos. 02079329.5 and 02079864.1.

The conductor 10 includes a metal conductive core 11, e.g. of copper plated with tin, surrounded by an isolation layer 12 having a low, but non-negligible conductivity. The isolation layer allows a small current to flow to neutralize charged particles, e.g. Argon ions, that are attracted to the conductor but limits current flow in the event of a breakdown to prevent damage to adjacent components. It should be appreciated that the invention may also be applied to high voltage conductors in other forms, e.g. plates or grids, as well as simple wires.

Figure 4:
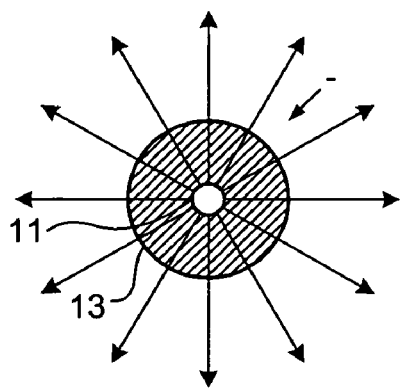
FIGS. 4 to 7 illustrate the effects of free charged particles on a conductor with an insulation layer and one with an isolation layer according to the invention.
Figure 5:
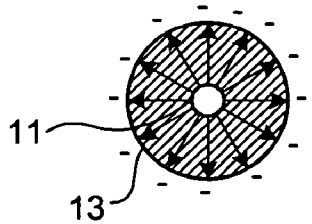

The functioning of the isolation layer of the present invention may be explained by comparison to the effect of a conventional high resistance insulator. As shown in FIGS. 4 and 5, a conductor 10 at a high, e.g., positive voltage generates an external electric field that attracts negatively charged particles, such as ions. If the conductor is covered by a high resistance insulator 13, the negatively charged particles build-up on the outside of the insulator 13 until the external electric field is compensated for (FIG. 5). The high voltage conductor then no longer fulfills its function.

Figure 6:
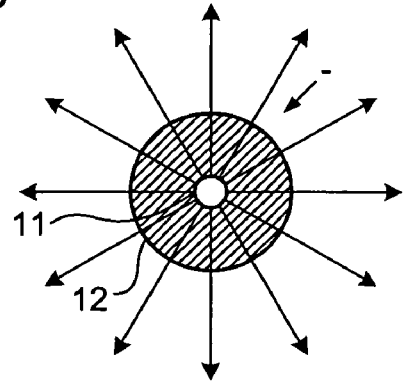
Figure 7:
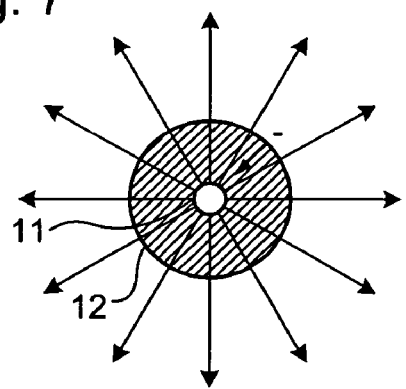

As shown in FIGS. 6 and 7, with an isolation layer according to the invention, negative particles are again attracted to the conductor 10 but in this case, the isolation layer 12 allows a small current to flow, sufficient to neutralize the charged particles incident on the conductor. There is the no charge build up and the external electric field remains undiminished. Of course, the same effect may occur with positively charged particles if the conductor is at a negative potential with respect to its surroundings.

The coating material and thickness is determined on the basis of the expected leakage current density and the voltage drop that can be permitted during normal use. Thus, for an expected current density of 1 $nAm^{-2}$ and a maximum voltage drop of 10V, 1% of the operating voltage of 1000V, a resistance for the isolation layer of $1\times10^{10}$ $\Omega m^{-2}$ should be used. If the thickness t of the isolation layer is approximately 10 µm, a resistivity ρ of $1\times10^{15}$ $\Omega m$ should be used. A coating of $Al_2O_3$, $SiO_2$ or a lacquer may be used. Other materials may also be suitable.

While specific embodiments of the invention have been described above, it will be appreciated that the invention may be practiced otherwise than as described. The description is not intended to limit the invention.

What is claimed is:

1. A lithographic apparatus comprising:
    an illumination system for conditioning a beam of radiation;
    a support for supporting a patterning device, the patterning device serving to impart the beam of radiation with a pattern in its cross-section;
    a substrate table for holding a substrate;
    a projection system for projecting the patterned beam onto a target portion of the substrate; and
    a high voltage conductor in a part of the apparatus that is evacuated or at a low pressure during normal use of the apparatus,
    wherein said conductor is coated by an isolation layer having a conductivity that is high enough to prevent charge build-up on the outside thereof during use of the apparatus, and low enough to limit peak current flow during a breakdown, and
    wherein said conductor is part of an electrostatic pellicle.

2. An apparatus according to claim 1, wherein the total resistance of said isolation layer is in the range of about $1\times10^8$ $\Omega m^{-2}$ to about $1\times10^{12}$ $\Omega m^{-2}$.

3. An apparatus according to claim 2, wherein the total resistance of said isolation layer is in the range of about $1\times10^9$ $\Omega m^{-2}$ to about $1\times10^{11}$, $\Omega m^{-2}$.

4. An apparatus according to claim 1, wherein said isolation layer comprises a material selected from the group consisting of: $Al_2O_3$, $SiO_2$, and lacquers.

5. An apparatus according to claim 1, wherein the thickness of said isolation layer is in the range of about 10 µm to about 50 µm.

6. An apparatus according to claim 1, wherein said isolation layer is made of a material having a resistivity in the range of about $1\times10^{13}$ $\Omega m$ to about $1\times10^{17}$ $\Omega m$.

7. An apparatus according to claim 6, wherein said isolation layer is made of a material having a resistivity in the range of about $1\times10^{14}$ $\Omega m$ to about $1\times10^{16}$ $\Omega m$.

8. A device manufacturing method using a lithographic apparatus, the method comprising:
    patterning a beam of radiation;
    projecting the patterned beam of radiation onto a target portion of a substrate; and
    supplying high voltage to a part of the apparatus with a high voltage conductor, said conductor being coated by an isolation layer having a conductivity that is high enough to prevent charge build-up on the outside thereof during use of the apparatus, and low enough to limit peak current flow during a breakdown,
    wherein said conductor is part of am electrostatic pellicle.

9. A method according to claim 8, wherein the total resistance of said isolation layer is in the range of about $1\times10^8$ $\Omega m^{-2}$ to about $1\times10^{12}$ $\Omega m^{-2}$.

10. A method according to claim 9, wherein the total resistance of said isolation layer is in the range of about $1\times10^9$ $\Omega m^{-2}$ to about $1\times10^{11}$, $\Omega m^{-2}$.

11. A method according to claim 8, wherein said isolation layer is made of a material having a resistivity in the range of about $1\times10^{13}$ $\Omega m$ to about $1\times10^{17}$ $\Omega m$.

12. A method according to claim 11, wherein said isolation layer is made of a material having a resistivity in the range of about $1\times10^{14}$ $\Omega m$ to about $1\times10^{16}$ $\Omega m$.

* * * * *